(12) United States Patent
Huang et al.

(10) Patent No.: US 6,757,208 B1
(45) Date of Patent: Jun. 29, 2004

(54) DUAL-BIT NITRIDE READ ONLY MEMORY CELL WITH PARASITIC AMPLIFIER AND METHODS OF FABRICATING AND READING THE SAME

(75) Inventors: Chiu-Tsung Huang, Hsinchu (TW); Chih-Wei Hung, Hsinchu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/665,599

(22) Filed: Sep. 22, 2003

(30) Foreign Application Priority Data

Feb. 14, 2003 (TW) ........................ 92103059 A

(51) Int. Cl.$^7$ ............................................. G11C 17/14
(52) U.S. Cl. .................. 365/225.6; 365/104; 365/177; 257/406; 257/405; 438/287
(58) Field of Search ................................ 365/103, 104, 365/94, 174, 177, 225.6; 257/405, 406, 411; 438/287, 288

(56) References Cited

U.S. PATENT DOCUMENTS 5,578,967 A * 11/1996 Harvey ..................... 330/263

6,233,168 B1 * 5/2001 Kokubun et al. .......... 365/104

* cited by examiner

*Primary Examiner*—Andrew Q. Tran
(74) *Attorney, Agent, or Firm*—Birch, Stewart, Kolasch & Birch, LLP

(57) ABSTRACT

Dual-bit nitride read only memory (NROM) cell with parasitic amplifier and method of fabricating and reading the same. A NROM cell comprises a semiconductor substrate with a first well region having a conductive type opposite that of the substrate disposed therein. A second well region having a conductive type opposite to the first well region is disposed in the first well region. A gate dielectric layer is disposed over portions of the second well region, wherein the gate dielectric layer comprises a nitride layer. A conductive layer is disposed on the gate dielectric layer to form a gate. And, a pair of first doped regions having a conductive type opposite to the second well region are symmetrically disposed in the second well region of both sides of the gate, wherein one of the first doped regions, the second well region and the first well region constitute a parasitic current amplifier.

25 Claims, 6 Drawing Sheets

DUAL-BIT NITRIDE READ ONLY MEMORY CELL WITH PARASITIC AMPLIFIER AND METHODS OF FABRICATING AND READING THE SAME

This nonprovisional application claims priority under 35 U.S.C. § 119(a) on patent application Ser. No(s). 092103059 filed in TAIWAN, R.O.C. on Feb. 14, 2003, which is(are) herein incorporated by reference.

BACKGROUND OF THE INVENTION

1. Field of the Invention

The present invention relates to a nonvolatile (NVM) device. More particularly, it relates to a dual-bit nitride read only memory (NROM) cell with parasitic amplifier and methods of fabricating and reading the same.

2. Description of the Related Art

In the nonvolatile memory (NVM) industry, the development of nitride read-only memory (NROM) started in 1996. Newer non-volatile memory technology utilizes oxide-nitride-oxide (ONO) gate dielectric and known mechanisms of programming and erasing to create two separate bits per cell. Thus, the NROM bit size is half of the cell area. Since silicon die size is a main element of cost structuring, it is apparent why the NROM technology is considered an economic breakthrough.

FIG. 1 is a schematic cross-section of a conventional dual-bit nitride read only memory cell. The cell includes a substrate 10 and two doped regions 12 and 14 therein, having a conductive type opposite to the substrate 10. On top of the substrate 10 lies an oxide-nitride-oxide (ONO) structure 22 having a layer of silicon nitride 18 sandwiched between two oxide layers 16 and 20. On top of the ONO structure 22 lies a gate conductor 24. Between doped regions 12 and 14 is a channel 26 formed under ONO structure 22.

The silicon nitride layer 18 in the ONO structure 22 has two chargeable areas 28 and 30 adjacent to the doped regions 12 and 14. These chargeable areas 28 and 30 are used for storing charges during memory cell programming. To program the left bit (not shown) close to area 28, the left doped region 12 is the drain and receives a high programming voltage. Simultaneously, the right doped region 14 is the source and grounded. The opposite is true for programming area 30. Moreover, each bit can be read in a direction opposite its programming direction. To read the left bit, stored in area 28, left doped region 12 is the source and right doped region 14 is the drain. The opposite is true for reading the right bit, stored in area 30. In addition, the bits can be erased in the same direction in which they are programmed.

Reading of the described NROM device can be achieved by conventional MOS transistor operations. When charges are present in the area 28 or 30 (i.e. the bit is programmed), the raised threshold of the device does not permit the device place to enter a conductive state during reading. If charges are not present, the read voltage on gate conductor 24 can overcome the much lower threshold and accordingly, channel 26 becomes inverted and hence conductive.

In U.S. Pat. No. 5,768,192, Eitan discloses an improved reading method of NROM cell, wherein the direction thereof is opposite to that of programming.

SUMMARY OF THE INVENTION

Accordingly, an object of the invention is to provide a novel dual-bit nitride read only memory cell having a parasitic current amplifier therein contributive to reading out the memory status of the bits therein.

Another object of the invention is to provide methods of fabricating and reading a dual-bit nitride read only memory cell with parasitic current amplifier, wherein the current amplifier can amplify leakage currents sensed therein into amplified currents. Thus, the memory status of a reading bit can be precisely read out through examination of the amplified currents.

Thus, the dual-bit nitride read only memory cell with parasitic amplifier in accordance with the present invention comprises a semiconductor substrate. A first well region is disposed in the substrate, having a conductive type opposite to the substrate. A second well region is disposed in the first well region having a conductive type opposite to the second well region. A gate dielectric layer is disposed over portions of the second well region, wherein the gate dielectric layer comprises a nitride layer. A conductive layer is disposed on the gate dielectric layer to form a gate. And, a pair of first doped regions are symmetrically disposed in the second well region on both sides of the gate, having a conductive type opposite to the second well region, wherein one of the first doped regions, the second well region, and the first well region constitute a parasitic current amplifier.

Furthermore, the method of fabricating the dual-bit nitride read only memory cell with parasitic amplifier in accordance with the present invention comprises providing a semiconductor substrate, forming a first well region in the substrate having a conductive type opposite to the substrate, forming a second well region having a conductive type opposite to the first well region in the first well region, sequentially forming a dielectric layer and a conductive layer over the portions of second well region to form a gate thereon, wherein the dielectric layer comprises a nitride layer, and symmetrically forming a pair of first doped regions having a conductive type opposite to the second well region in the second well region on both sides of the gate, wherein one of the first doped regions, the second well region and the first well region constitute a parasitic current amplifier.

Moreover, the method of reading the dual-bit nitride read only memory cell with parasitic amplifier in accordance with the present invention comprises selecting a reading bit of the dual-bit nitride read only memory cell, floating the gate and grounding one of the first doped region on the opposite side thereof, applying a first voltage to the other first doped region adjacent to the reading bit to generate leakage currents into the second well region, applying a second voltage to the first well region on the opposite side of the reading bit to turn on the current amplifier therein and amplify the leakage currents and measuring amplified currents from the first well region on the opposite side of the reading bit to acquire the memory status of the reading bit.

In the present invention, a novel structure of a dualbit nitride read only memory cell having parasitic amplifier is provided and the parasitic amplifier formed by a BJT therein acts as a current amplifier during reading of the memory status of bits therein.

In addition, reading of the memory status of the bits is achieved by examination of the gate-induced drain leakages (GIDL) caused by the stored charges therein. The GIDL currents can be further amplified by the parasitic amplifier to generate amplified currents and memory status of the bits can be thus ascertained by the level of the amplified currents.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The present invention provides a dual-bit nitride read only memory cell with parasitic amplifier and schematic cross-sections FIG. 2 to FIG. 7 illustrate the fabricating process thereof according to an embodiment of the invention.

Figure 1:
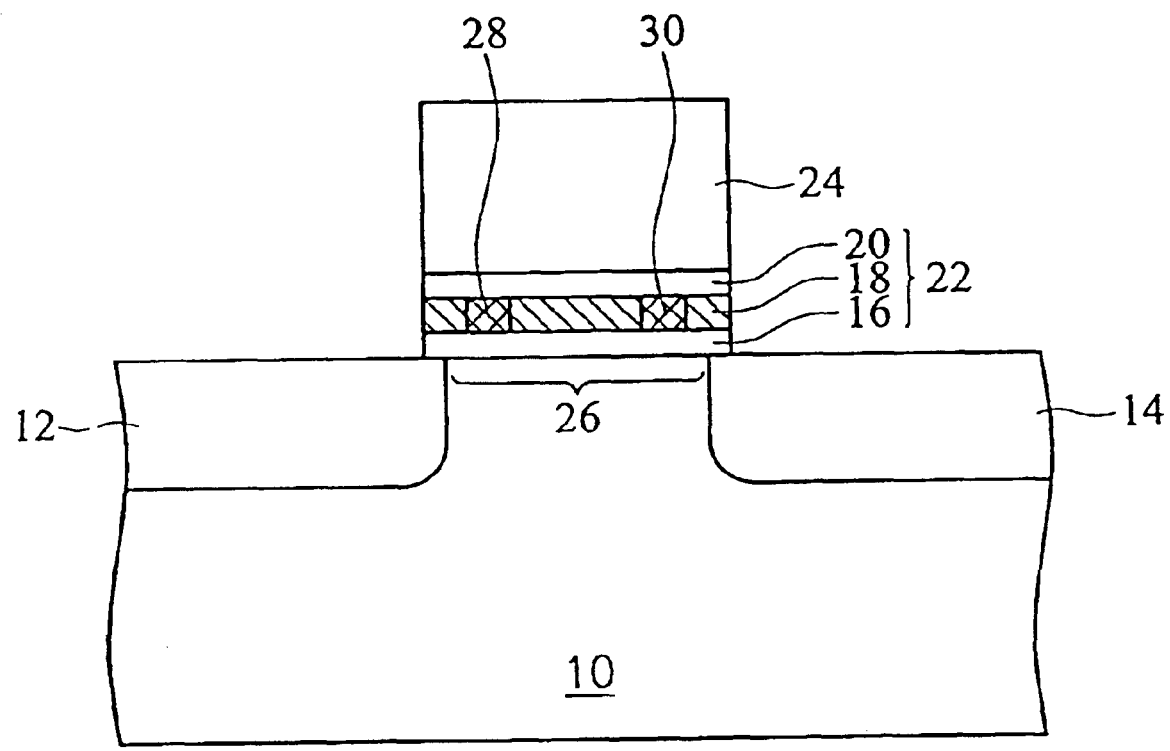
FIG. 1 is a schematic cross-section of a dual-bit nitride read only memory (NROM) cell of the Prior Art.
Figure 2:
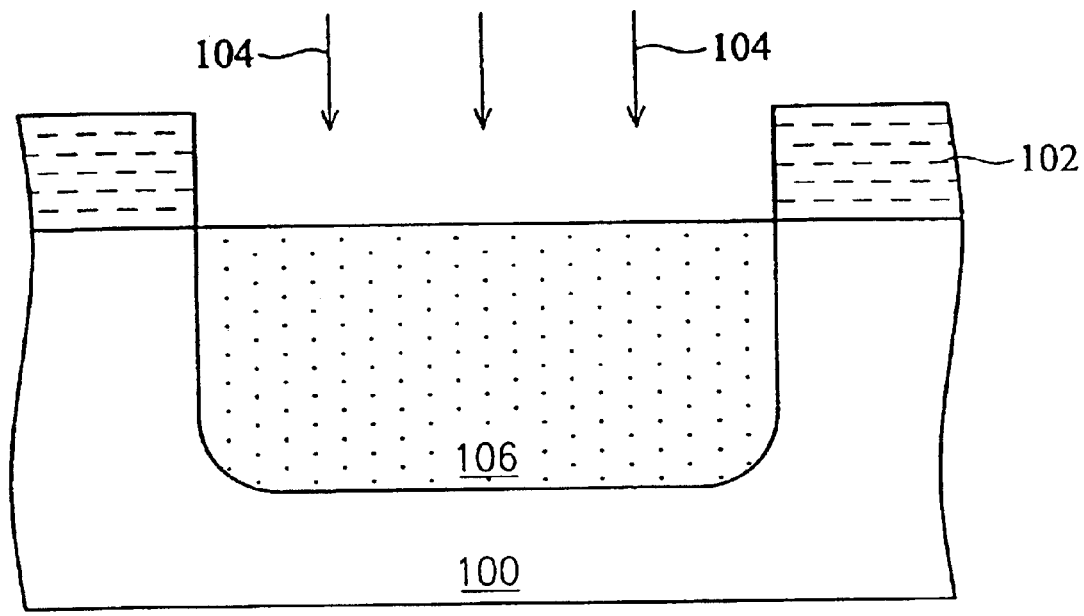
FIGS. 2~7 are schematic cross-sections showing the fabricating process of the dual-bit nitride read only memory cell of the invention.

In FIG. 2, a semiconductor substrate 100, for example a P-type silicon substrate, is provided. Next, a patterned mask layer 102 for defining the memory cell is formed on the substrate 100 and exposes portions of the substrate surface. The mask layer 102 can be comprised of, for example, photoresist (PR) materials. Next, an ion implantation 104 is performed to implant N-type dopants such phosphorous (P) ions into the exposed substrate 100 at implant energy between 300 KeV and 1000 KeV using the mask layer 102 as implanting mask. Thus, a first well region 106 having a conductive type opposite to the substrate 100 is formed in the substrate 100. The doping concentration of the first well region 106 can be, for example, between $1*10^{16}$ atoms/cm$^2$ and $1*10^{18}$ atoms/cm$^2$.

Figure 3:
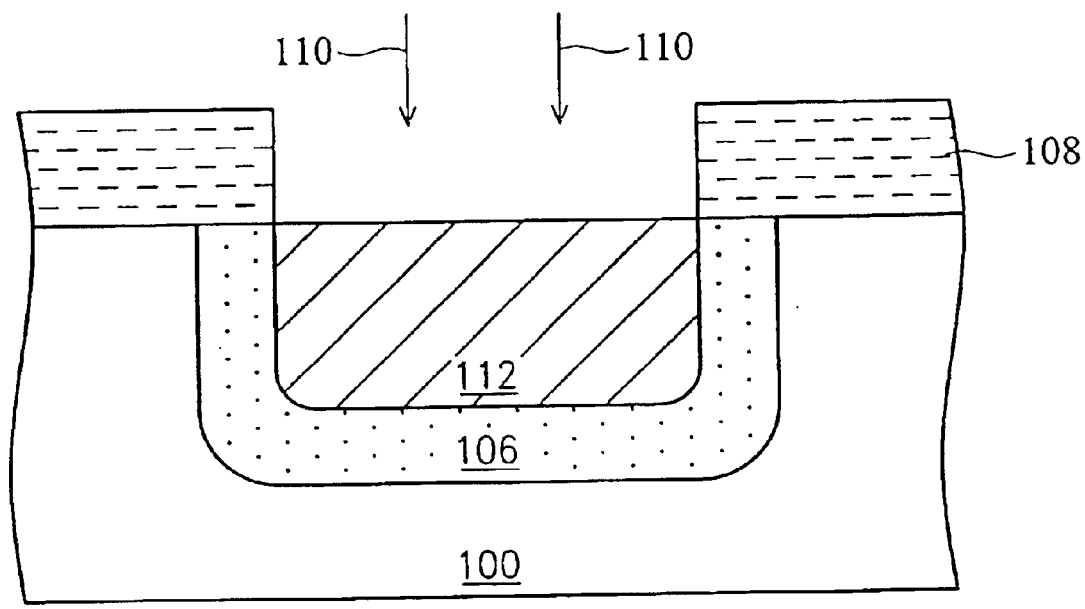

In FIG. 3, another patterned mask layer 108 for defining second well region is formed on the substrate 100 after removal of the previous mask layer 102 and exposes portions of the first well region 106 therein. The mask layer 108 can be comprised of, for example, photoresist (PR) materials. Another ion implantation 110 is performed to implant P-type dopants such as boron (B) ions into the exposed first well region 106 at implant energy between 50 KeV and 1000 KeV using the mask layer 108 as an implanting mask. Thus, a second well region 112 having a conductive type opposite to the first well region 106 is formed in the first well region 106. The doping concentration of the second well region 112 can be, for example, between $1*10^{16}$ atoms/cm$^2$ and $1*10^{18}$ atoms/cm$^2$.

Figure 4:
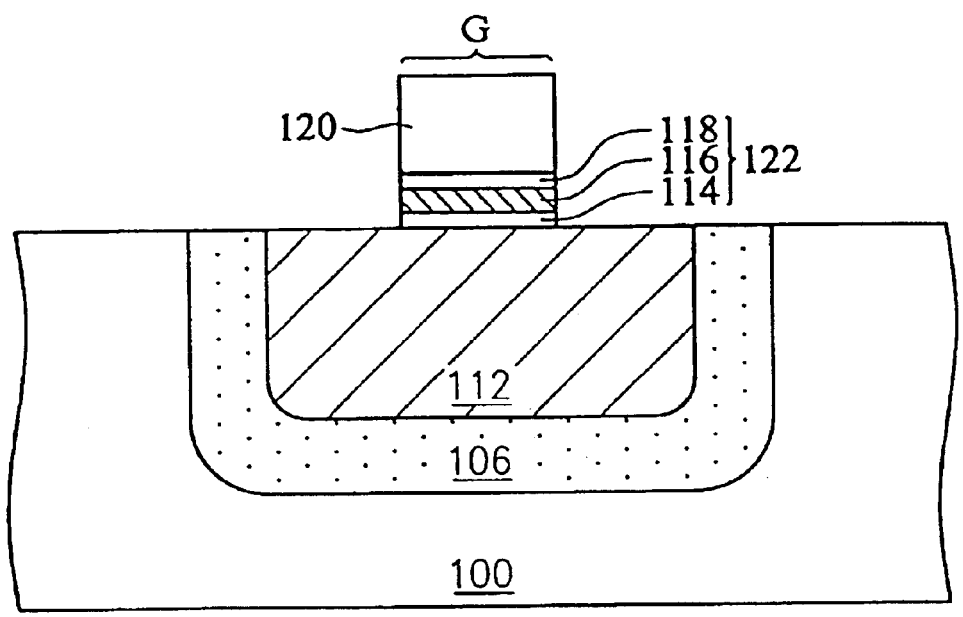

In FIG. 4, a composite dielectric layer 122 including a nitride layer and a conductive layer 120 are sequentially formed on the substrate 100 to form a gate G thereon, overlying portions of the second well region 112. The composite dielectric layer 122 including a nitride layer can be, for example, a composite layer formed by sequentially stacking the oxide layer 114, the silicon nitride layer 116 and the oxide layer 118 on the substrate 100, and the so-called oxide-nitride-oxide (ONO) layer and the overall thickness thereof can be between 100 Å and 250 Å. The thickness ratio of each stacked layer forming the composite layer can be, for example, preferably between 1:2:2 and 1:4:4. The conductive layer 120 can be comprised of, for example, polysilicon and the thickness thereof can be between 1000 Å and 3000 Å.

Figure 5:
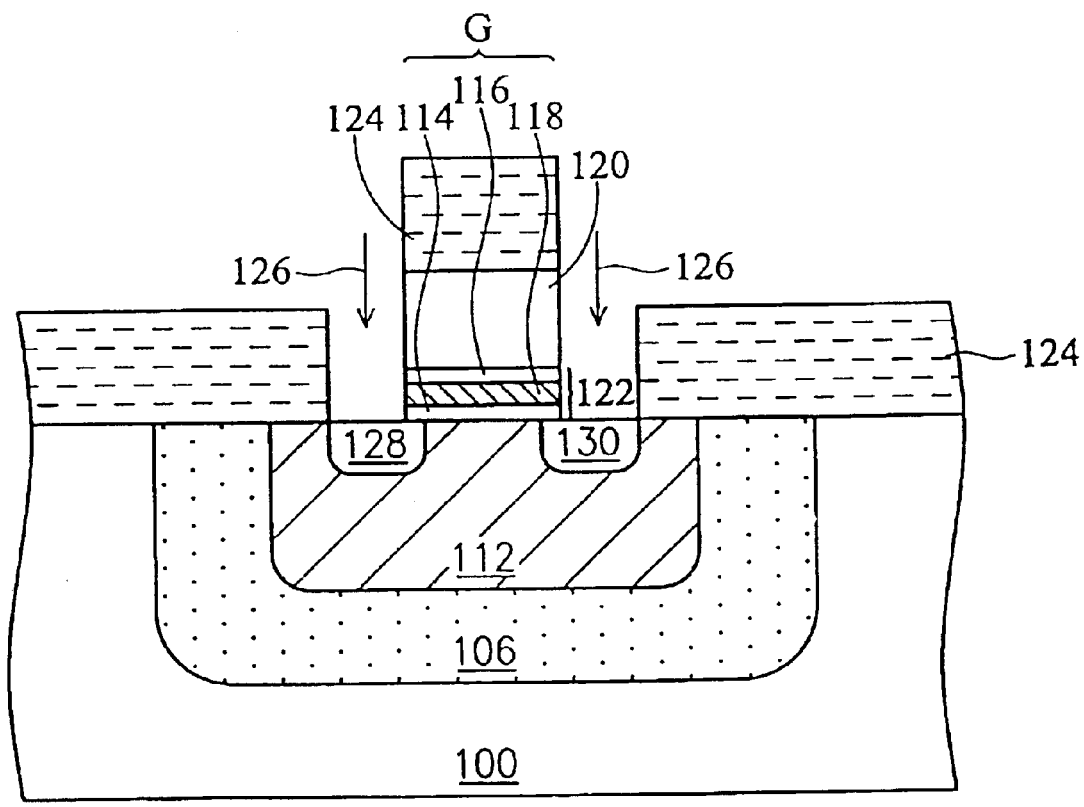

In FIG. 5, another patterned mask layer 124 for forming source/drain regions is formed on the gate G and the substrate 100, exposing portions of the second well region 112. The mask layer 124 can be comprised of, for example, photoresist (PR) materials. Ion implantation 126 is performed to implant N-type dopants such phosphorous (P) or arsenic (As) ions into the exposed second well region 112 at implant energy between 20 KeV and 120 KeV using the mask layer 124 as implanting mask. Thus, two first doped regions 128 and 130 are symmetrically formed in the exposed second well region 112 adjacent to the gate G and partially contact the gate G. These first doped regions 128 and 130 have conductive type opposite to the second well region 112 and the doping concentration thereof can be, for example, between $1*10^{19}$ atoms/cm$^2$ and $1*10^{21}$ atoms/cm$^2$.

Figure 6:
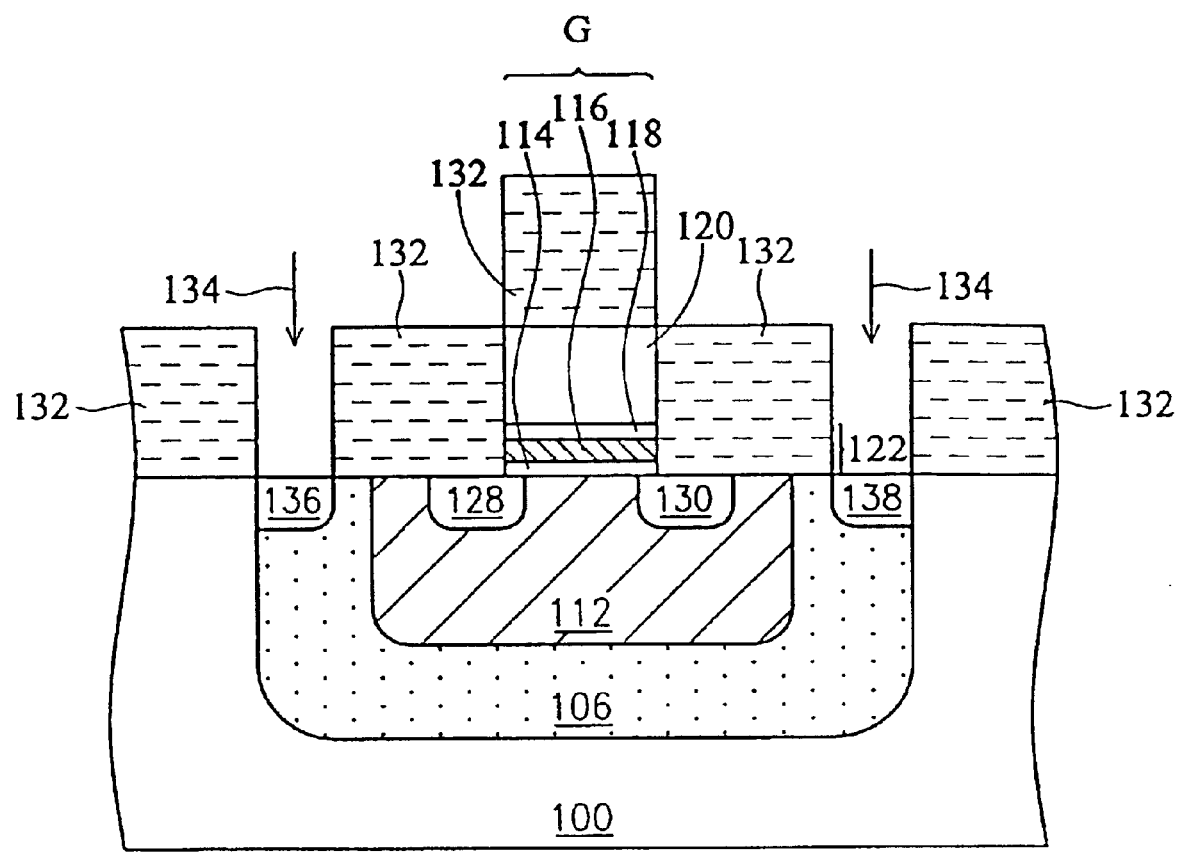

In FIG. 6, another patterned mask layer 132 for defining contact nodes is formed on portions of the substrate 100 and the gate G after removal of the previous mask layer 124 and exposes portions of the first well regions 106. The mask layer 132 can be comprised of, for example, photoresist (PR) materials. Ion implantation 134 is performed to implant N-type dopants such phosphorous (P) or arsenic (As) ions into the exposed first well region 106 at implant energy between 20 KeV and 120 KeV using the mask layer 132 as implanting mask. Thus, two second doped regions 136 and 138 having the same conductive type as the first well region 106 are symmetrically formed in the first well region 106 on both sides of the gate G. The doping concentration of the second doped regions 136 and 138 can be, for example, between $1*10^{19}$ atoms/cm$^2$ and $1*10^{21}$ atoms/cm$^2$.

Figure 7:
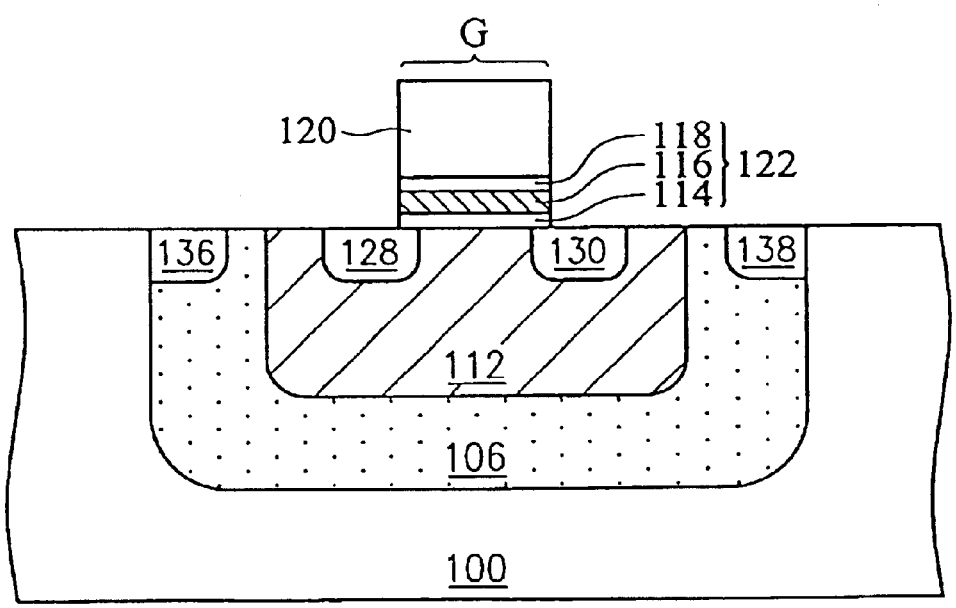

In FIG. 7, after removal of the previous mask layer 132, the fabricating process of the dual-bit nitride read only memory cell with parasitic amplifier is complete and the structure cross-section thereof is illustrated. The dual-bit nitride read only memory cell comprises a semiconductor substrate 100. A first well region 106 is disposed in the substrate 100, having a conductive type opposite to the substrate 100. A second well region 112 is disposed in the first well region 106, having a conductive type opposite to the second well region 112. A gate dielectric layer 122, for example a composite ONO layer including the stacked oxide layer 114, silicon nitride layer 116 and oxide layer 118 formed on the substrate 100, disposed over portions of the second well region 112. A conductive layer 120 is disposed on the gate dielectric layer 122 to form a gate G. And, a pair of first doped regions 128 and 130 are symmetrically disposed in the second well region 112 on both sides of the gate, having a conductive type opposite to the second well region 112, wherein the first doped regions 128 or 130, the second well region 112, and the first well region 106 constitute a parasitic current amplifier.

Figure 8:
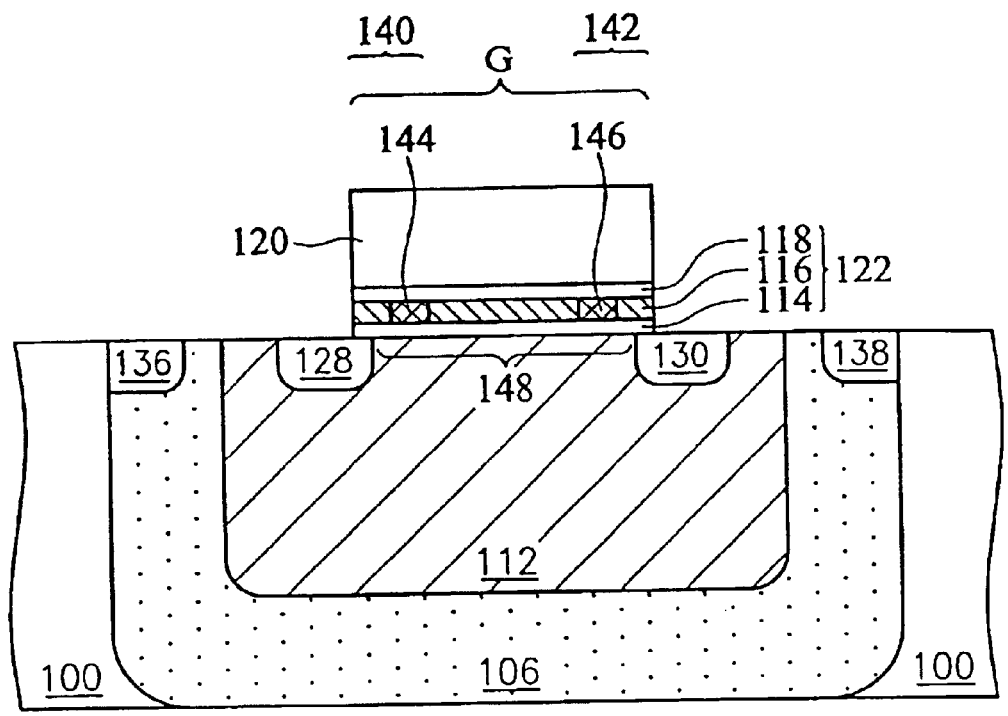
FIGS. 8~10 are schematic cross-sections of reading, programming and erasing the dual-bit nitride read only memory cell of the invention.
Figure 9:
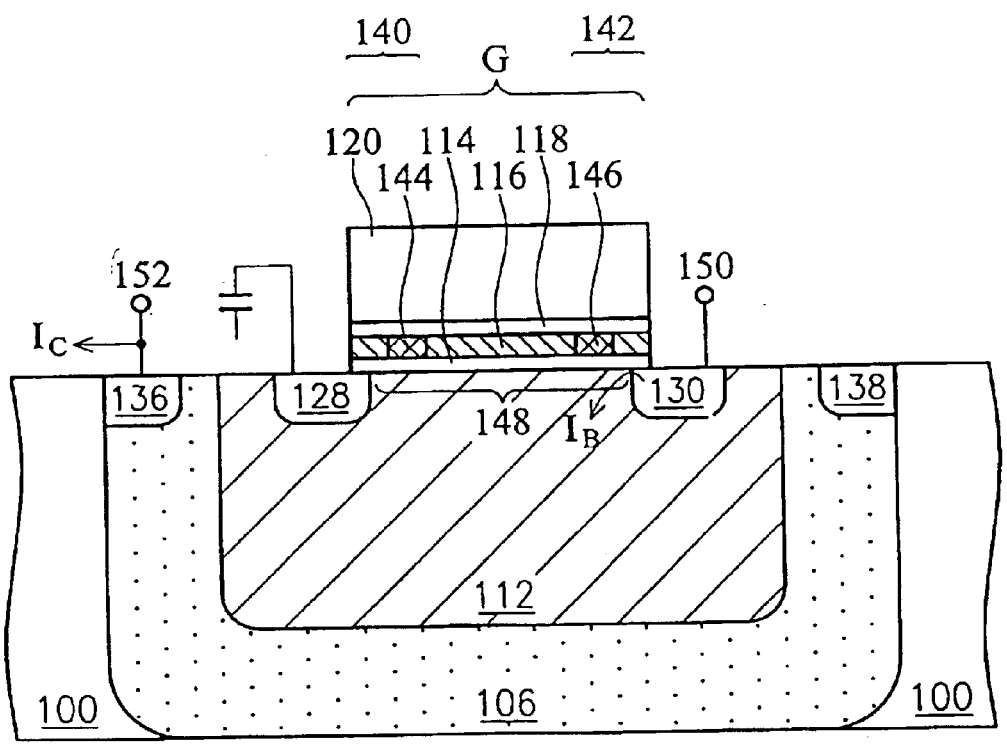
Figure 10:
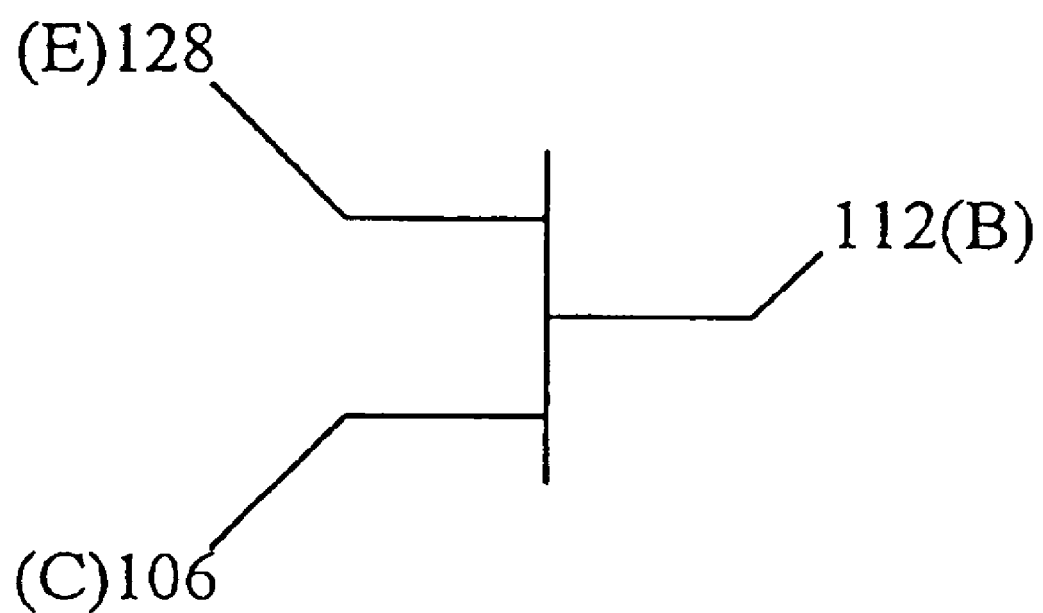

Methods to program, erase, and read the dual-bit nitride read only memory cell with parasitic amplifier according to an embodiment of the present invention are schematically illustrated in FIG. 8 to FIG. 10.

In FIG. 8, two separate bits 140 and 142 of the nitride read only memory cell in accordance of the invention are located on both sides of the gate G. The silicon nitride layer 116 within the gate dielectric layer 122 provides two chargeable areas 144 and 146 respectively adjacent to the first doped regions 128 and 130. These chargeable areas 144 and 146 store charges during memory cell programming.

To program the left bit 140 close to the chargeable area 144, the left first doped region 128 is the drain and receives a high programming voltage of about 1 to 10 volts. Simultaneously, the right first doped region 130 is the source and is grounded. Simultaneously, the gate G receives a proper voltage between 1 to 10 volts to turn on a channel 148 located at the substrate 100 between the first doped regions 128 and 130 and hot electrons (not shown) can be formed and injected into the chargeable area 144 by so-called hot electron phenomenon. The opposite is true for programming the right bit 142, the right first doped region 130 is the drain and receives a high programming voltage (not shown) about 1 to 10 volts. Simultaneously, the left first doped region 128 is the source and is grounded. Simultaneously, the gate G receives a proper voltage between 1 to 10 volts to turn on a channel 148 located at the substrate 100 between the first doped regions 128 and 130 and hot electrons (not shown) can be formed and injected into and stored in the chargeable area 146.

To erase the left bit 140, the left first doped region 128 receives a high erasing voltage of about 1 to 10 volts. Simultaneously, the right first doped region 130 is floating. Simultaneously, the gate G receives a proper, voltage between 0 to −5 volts to generate holes $h^+$ (not shown) into the chargeable area 144 to erase the left bit 140. The opposite is true for erasing the right bit 142, wherein the right first doped region 130 receives a high erasing voltage about 1 to 10 volts. Simultaneously, the left first doped region 128 is floating. Simultaneously, the gate G receives a proper voltage between 0 to −5 volts to generate holes $h^+$ (not shown) into the chargeable area 146 to erase right bit 142.

In FIG. 9, a method for reading the memory status of bits of the dual-bit nitride read only memory cell is illustrated. First, a reading bit such as the right bit 142, for example, is selected and the gate G and the first doped region 128 opposite to the right bit 142 are respectively floated and grounded. Next, a first voltage 150 about 1 to 10 volts is applied to the right first doped region 130 adjacent to the reading bit. Thus, leakage currents $I_B$ generated by a so call GIDL (Gate-induced drain leakage) phenomenon flow into the second well region 112. Leakage currents $I_B$ between $10^{-6}$ μA and $10^{-4}$ μA can be measured when no charges are stored in the chargeable area 146 of the right bit 142 (referring to the memory status 0). Higher leakages $I_B$ between $10^{-2}$ μA and 1 μA can be measured by proper negative voltages induced by the stored charges in the chargeable area 146 of in the right bit 142 (referring to the memory status 1). Then a second voltage 152 between 1 and 10 volts is applied to the second doped region 136 in the first well region 106 on the opposite side of the reading bit 142 to turn on a parasitic bipolar junction transistor (BJT) constituted of the first doped region 128, the second well region 112 and the first well region 106 as a current amplifier for amplifying the leakage current $I_B$. The schematic circuit diagram of the current amplifier is shown in FIG. 10. The current amplifier provided by the parasitic BJT includes an emitter E by the first doped region 128, a base B by the second well region 112 and a collector C by the first well region 106 with current gains β between 1 fold and 100 folds. The leakage currents $I_B$ can be amplified into amplified currents $I_C$ through a conventional equation $I_C=\beta I_B$. The memory status of the reading bit can be apparently and precisely read out through examination of the amperes of the amplified current $I_C$ at the collector C (referring to the second doped region 136 within the first well region 106 on the opposite side of the bit 142). When charges stored in the right bit 142, referring a memory status 1, higher leakage currents In between $10^{-2}$ and 1 μA can be amplified. Thus the amplified currents $I_C$ with more than $10^{-2}$ μA, normally between $10^{-2}$ and $10^2$ μA, can be measured. Conversely, when no charges are stored in the right bit 142, referring to a memory status 0, the amplified current $I_C$ with less than $10^{-2}$ μA, normally between $10^{-6}$ and $10^{-2}$ μA can be measured. Huge differences between the amplified currents $I_C$ for examination of the bit status 0 and 1 can be measured to acquire the memory status of the reading bit 142.

The opposite is true for reading the left bit 140, wherein the memory status thereof can be read out by oppositely switching the described voltage applying nodes.

The dual-bit nitride read only memory cell with parasitic amplifier of the invention has the following characteristics.

First, a novel structure of the dual-bit nitride read only memory cell having parasitic amplifier is provided by the invention and the parasitic amplifier formed by a BJT therein acts as a current amplifier during reading of the memory status of bits therein.

In addition, reading of the memory status of the bits is achieved by examination of the gate-induced drain leakages (GIDL) caused by the stored charges therein. The GIDL currents can be further amplified by the parasitic amplifier to generate amplified currents such that memory status of the bits can thus be ascertained by indicating the level of the amplified currents. The novel reading method of the invention precisely reads out the bit status within the memory cell and is different to that for reading particular bit status having opposite operation direction to programming thereof disclosed in Eitan's U.S. Pat. No. 5,768,192 patent.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dual-bit nitride read only memory cell with parasitic amplifier, comprising:
   a semiconductor substrate;
   a first well region disposed in the semiconductor substrate and having a first conductive type opposite to the semiconductor substrate;
   a second well region disposed in the first well region and having a second conductive type opposite to the first well region;
   a gate dielectric layer disposed over portions of the second well region, wherein the gate dielectric layer comprises a nitride layer;
   a conductive layer disposed on the gate dielectric layer to form a gate; and
   a pair of first doped regions symmetrically disposed in the second well region on both sides of the gate and having a third conductive type opposite to the second well region, wherein one of the first doped regions, the second well region and the first well region constitute a parasitic current amplifier.

2. The nitride read only memory cell as claimed in claim 1, wherein the semiconductor substrate is a P-type silicon substrate.

3. The nitride read only memory cell as claimed in claim 1, wherein the conductive layer is comprised of polysilicon.

4. The nitride read only memory cell as claimed in claim 1, wherein the first doped regions are N-type doped regions having a doping concentration between $1*10^{19}$ and $1*10^{21}$ atoms/cm².

5. The nitride read only memory cell as claimed in claim 1, further comprising a pair of second doped regions symmetrically disposed in the first well region on both sides of the gate.

6. The nitride read only memory cell as claimed in claim 5, wherein the second doped regions are N-type doped regions having a doping concentration between $1*10^{19}$ and $1*10^{21}$ atoms/cm².

7. The nitride read only memory cell as claimed in claim 1, wherein the parasitic current amplifier is a bipolar junction transistor (BJT) including an emitter constituted of one of the first doped regions, a base constituted of the second well region and a collector constituted of the first well region.

8. The nitride read only memory cell as claimed in claim 1, wherein the gate dielectric layer is oxide-nitride-oxide (ONO) layer.

9. A method of fabricating a dual-bit nitride read only memory cell, comprising the steps of:
   providing a semiconductor substrate;
   forming a first well region in the semiconductor substrate, and the first well region having a first conductive type opposite to the semiconductor substrate;
   forming a second well region in the first well region, and the second well region having a second conductive type opposite to the first well region;
   sequentially forming a dielectric layer and a conductive layer over the second well region to form a gate thereon, wherein the dielectric layer comprises a nitride layer; and
   symmetrically forming a pair of first doped regions in the second well region on both sides of the gate, and the first doped regions having a third conductive type opposite to the second well region, wherein one of the first doped regions, the second well region and the first well region constitute a parasitic current amplifier.

10. The method as claimed in claim 9, wherein the dielectric layer is an oxide-nitride-oxide layer.

11. The method as claimed in claim 9, wherein the first doped regions are N-type doped regions having a doping concentration between $1*10^{19}$ and $1*10^{21}$ atoms/cm$^2$.

12. The method as claimed in claim 9, further comprising the step of symmetrically forming a pair of second doped regions in the first well region on both sides of the gate.

13. The method as claimed in claim 12, wherein the second doped regions are N-type doped regions having a doping concentration between $1*10^{19}$ and $1*10^{21}$ atoms/cm$^2$.

14. The method as claimed in claim 9, wherein the semiconductor substrate is a P-type silicon substrate.

15. The method as claimed in claim 9, wherein the conductive layer is comprised of polysilicon.

16. The method as claimed in claim 9, wherein the parasitic amplifier is a bipolar junction transistor (BJT) including an emitter constituted of one of the first doped regions, a base constituted of the second well region and a collector constituted of the first well region.

17. A method of reading a dual-bit nitride read only memory cell constituted of a semiconductor substrate, a first well region having a first conductive type opposite to the substrate disposed in the substrate, a second well region having a second conductive type opposite to the first well region disposed in the first well region, a gate dielectric layer comprising a nitride layer disposed over portions of the second well region, a conductive layer disposed on the gate dielectric layer to form a gate, and a pair of first doped regions symmetrically having a third conductive type opposite to the second well region disposed in the second well region on both sides of the gate, wherein one of the first doped regions, the second well region and the first well region constitutes a parasitic current amplifier, comprising the steps of:
   selecting a reading bit of the dual-bit nitride read only memory cell, floating the gate and grounding one of the first doped region on the opposite side thereof;
   applying a first voltage to the other first doped region adjacent to the reading bit to generate a leakage current into the second well region;
   applying a second voltage to the first well region on the opposite side of the reading bit to turn on the current amplifier therein and amplify the leakage currents; and
   measuring an amplified current from the first well region on the opposite side of the reading bit to acquire the memory status of the reading bit.

18. The method as claimed in claim 17, wherein the reading bit is 0 when the amplified current is less than $10^{-2}$ μA.

19. The method as claimed in claim 17, wherein the reading bit is 1 when the amplified current exceeds or equal to $10^{-2}$ μA.

20. The method as claimed in claim 17, wherein the first voltage is between 1 and 10 volts.

21. The method as claimed in claim 17, wherein the second voltage is between 1 and 10 volts.

22. The method as claimed in claim 17, wherein the parasitic current amplifier has a current gain about 1 fold to 100 folds.

23. The method as claimed in claim 17, wherein the leakage currents are gate-induced drain leakages (GIDL).

24. The method as claimed in claim 17, wherein the second voltage is applied to a second doped region in the first well region on the opposite side of the reading bit.

25. The method as claimed in claim 24, wherein the second doped region is N-type doped region having a doping concentration between $1*10^{19}$ and $1*10^{21}$ atoms/cm$^2$.

* * * * *